United States Patent
Okabe et al.

(10) Patent No.: US 7,954,452 B2
(45) Date of Patent: Jun. 7, 2011

(54) FILM FORMATION APPARATUS FOR SEMICONDUCTOR PROCESS AND METHOD FOR USING THE SAME

(75) Inventors: Tsuneyuki Okabe, Oshu (JP); Hitoshi Kato, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 612 days.

(21) Appl. No.: 11/878,274

(22) Filed: Jul. 23, 2007

(65) Prior Publication Data

US 2008/0076264 A1    Mar. 27, 2008

(30) Foreign Application Priority Data

Jul. 25, 2006  (JP) ................... 2006-202166

(51) Int. Cl.
- *C23C 16/00* (2006.01)
- *C23C 16/52* (2006.01)
- *C23C 16/455* (2006.01)
- *H01L 21/306* (2006.01)

(52) U.S. Cl. ........ 118/697; 118/715; 118/696; 118/724; 156/345.24; 156/245.26; 156/245.29; 156/245.37

(58) Field of Classification Search ................... 118/715, 118/696, 697, 724; 156/345.24, 345.26, 156/345.29, 345.37

See application file for complete search history.

(56) References Cited

U.S. PATENT DOCUMENTS

| | | | | |
|---|---|---|---|---|
| 5,044,314 A | * | 9/1991 | McNeilly | 118/715 |
| 5,380,370 A | * | 1/1995 | Niino et al. | 134/22.11 |
| 5,500,388 A | * | 3/1996 | Niino et al. | 438/482 |
| 5,637,153 A | * | 6/1997 | Niino et al. | 134/22.11 |
| 5,777,300 A | * | 7/1998 | Homma et al. | 219/679 |
| 6,165,853 A | * | 12/2000 | Nuttall et al. | 438/296 |
| 6,903,030 B2 | * | 6/2005 | Ishii et al. | 438/782 |
| 7,288,483 B1 | * | 10/2007 | Brown | 438/694 |
| 7,718,032 B2 | * | 5/2010 | Kent et al. | 156/345.37 |
| 7,723,237 B2 | * | 5/2010 | Hyland et al. | 438/706 |
| 7,795,148 B2 | * | 9/2010 | Brown | 438/694 |
| 2001/0055738 A1 | * | 12/2001 | Takahashi et al. | 432/2 |

(Continued)

FOREIGN PATENT DOCUMENTS

CN    1739072 A    2/2006

(Continued)

OTHER PUBLICATIONS

Chinese Office Action issued on Nov. 12, 2010 for Chinese Application No. 200710139047.6 with English translation.

*Primary Examiner* — Jeffrie R Lund
(74) *Attorney, Agent, or Firm* — Smith, Gambrell & Russell, LLP

(57) ABSTRACT

A method for using a film formation apparatus for a semiconductor process forms a first atmosphere inside an upstream gas passage between a gas supply source of a halogen acidic gas and a flow rate controller. The first atmosphere is set for the halogen acidic gas to have an average molecular weight of 20 or more and 23 or less. Further, the using method supplies the halogen acidic gas from the gas supply source through the upstream gas passage having the first atmosphere thus formed and the flow rate controller, thereby supplying a cleaning gas containing the halogen acidic gas into a reaction chamber of the film formation apparatus. A by-product film deposited on an inner surface of the reaction chamber is etched and removed by use of the cleaning gas thus supplied.

13 Claims, 12 Drawing Sheets

U.S. PATENT DOCUMENTS

| | | | |
|---|---|---|---|
| 2002/0019149 A1* | 2/2002 | Tanabe et al. | 438/798 |
| 2002/0062845 A1* | 5/2002 | Kawai et al. | 134/19 |
| 2004/0163677 A1* | 8/2004 | Takahashi et al. | 134/22.1 |
| 2004/0168638 A1* | 9/2004 | Ishii et al. | 118/724 |
| 2006/0021570 A1* | 2/2006 | Hasebe et al. | 118/697 |
| 2006/0076060 A1 | 4/2006 | Ohmi et al. | |
| 2006/0199357 A1* | 9/2006 | Wan et al. | 438/482 |
| 2006/0216941 A1* | 9/2006 | Hasebe et al. | 438/715 |
| 2006/0216949 A1* | 9/2006 | Hasebe et al. | 438/770 |
| 2007/0235411 A1* | 10/2007 | Brown | 216/57 |
| 2007/0298972 A1* | 12/2007 | Kent et al. | 505/500 |
| 2008/0076264 A1* | 3/2008 | Okabe et al. | 438/758 |
| 2008/0105194 A1* | 5/2008 | Nakao et al. | 117/97 |
| 2008/0142988 A1* | 6/2008 | Hyland et al. | 257/774 |
| 2008/0182423 A1* | 7/2008 | Hayashi et al. | 438/735 |
| 2008/0216871 A1* | 9/2008 | Brown | 134/19 |
| 2010/0237046 A1* | 9/2010 | Kent et al. | 216/58 |

FOREIGN PATENT DOCUMENTS

| | | |
|---|---|---|
| JP | 03-293726 | 12/1991 |
| WO | WO 9927572 A1 * | 6/1999 |

* cited by examiner

FILM FORMATION APPARATUS FOR SEMICONDUCTOR PROCESS AND METHOD FOR USING THE SAME

BACKGROUND OF THE INVENTION

1. Field of the Invention

The present invention relates to a film formation apparatus for a semiconductor process for forming a film on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon oxide film or silicon nitride film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is reduced to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the interior of the reaction tube, a stress is generated and causes peeling of some of the by-product films and the quartz of the reaction tube due to a difference in coefficient of thermal expansion between the quartz and by-product films. Consequently, particles are generated, and may decrease the yield of semiconductor devices to be fabricated and/or deteriorate some components of the processing apparatus.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube are thereby dry-etched and removed by the cleaning gas. Jpn. Pat. Appln. KOKAI Publication No. 3-293726 discloses a cleaning method of this kind. However, as described later, the present inventors have found that conventional cleaning methods of this kind may cause problems in that cleaning cannot be stably performed, the yield of products is decreased, and/or some components of apparatuses are deteriorate.

BRIEF SUMMARY OF THE INVENTION

An object of the present invention is to provide a film formation apparatus for a semiconductor process and a method for using the same, which can stably perform cleaning inside a reaction tube.

Another object of the present invention is to provide a film formation apparatus for a semiconductor process and a method for using the same, which can prevent a decrease in the yield of products and/or a deterioration of components of an apparatus.

According to a first aspect of the present invention, there is provided a method for using a film formation apparatus for a semiconductor process, the method comprising:

forming a first atmosphere inside an upstream gas passage between a gas supply source of a halogen acidic gas and a flow rate controller, the first atmosphere being set for the halogen acidic gas to have an average molecular weight of 20 or more and 23 or less;

supplying the halogen acidic gas from the gas supply source through the upstream gas passage having the first atmosphere thus formed and the flow rate controller, thereby supplying a cleaning gas containing the halogen acidic gas into a reaction chamber of the film formation apparatus; and etching and removing a by-product film deposited on an inner surface of the reaction chamber, by use of the cleaning gas thus supplied.

According to a second aspect of the present invention, there is provided a film formation apparatus for a semiconductor process, comprising:

a reaction chamber configured to accommodate a target substrate;

a heater configured to heat an interior of the reaction chamber;

an exhaust system configured to exhaust the interior of the reaction chamber;

a film formation gas supply circuit configured to supply a film formation gas, for forming a product film on the target substrate, into the reaction chamber;

a cleaning gas supply circuit configured to supply a cleaning gas, which contains a halogen acidic gas for removing a by-product film derived from the film formation gas, into the reaction chamber, the cleaning gas supply circuit including an upstream gas passage between a gas supply source of the halogen acidic gas and a flow rate controller; and a control section configured to control an operation of the apparatus, wherein the control section executes forming a first atmosphere inside the upstream gas passage, the first atmosphere being set for the halogen acidic gas to have an average molecular weight of 20 or more and 23 or less;

supplying the halogen acidic gas from the gas supply source through the upstream gas passage having the first atmosphere thus formed and the flow rate controller, thereby supplying a cleaning gas containing the halogen acidic gas into the reaction chamber; and etching and removing a by-product film deposited on an inner surface of the reaction chamber, by use of the cleaning gas thus supplied.

According to a third aspect of the present invention, there is provided a computer readable medium containing program instructions for execution on a processor, which, when executed by the processor, cause a film formation apparatus for a semiconductor process to execute forming a first atmosphere inside an upstream gas passage between a gas supply source of a halogen acidic gas and a flow rate controller, the first atmosphere being set for the halogen acidic gas to have an average molecular weight of 20 or more and 23 or less;

supplying the halogen acidic gas from the gas supply source through the upstream gas passage having the first atmosphere thus formed and the flow rate controller, thereby supplying a cleaning gas containing the halogen acidic gas into a reaction chamber of the film formation apparatus; and etching and removing a by-product film deposited on an inner surface of the reaction chamber, by use of the cleaning gas thus supplied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
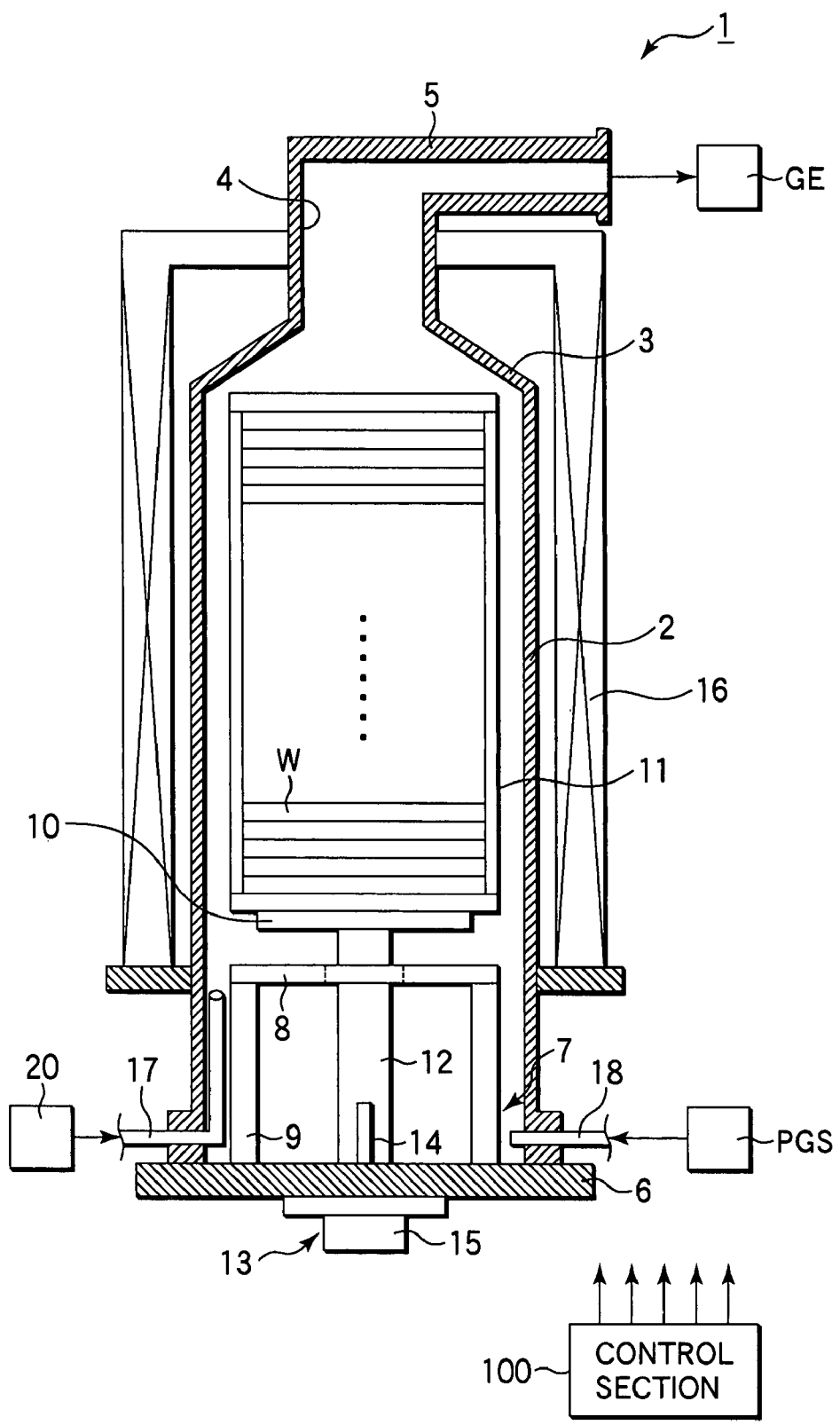
FIG. 1 is a view showing a vertical heat-processing apparatus according to an embodiment of the present invention.

In the process of developing the present invention, the inventors studied problems with regard to conventional methods for cleaning the interior of a reaction tube used in a film formation apparatus for a semiconductor process. As a result, the inventors have arrived at the findings given below.

Conventionally, where a cleaning gas, such as hydrogen fluoride, is supplied into a reaction tube, the gas is supplied through a gas supply line set at, e.g., a temperature of from room temperature to 40° C. and a pressure of from atmospheric pressure to 131 kPa (985 Torr). In this case, the interior of the gas supply line may be corroded by liquefied hydrogen fluoride, whereby a metal compound, such as a metal fluoride, is deposited inside the reaction tube, and/or metal contamination occurs on wafers W. Further, particles are generated, and may decrease the yield of semiconductor devices to be fabricated and/or deteriorate some components of the processing apparatus. Further, it may be difficult to stably supply the cleaning gas at a predetermined flow rate into the reaction tube.

In order to solve these problems, for example, hydrogen fluoride (HF) solution may be used to clean the reaction tube. In this case, by-product films are removed by wet etching. However, this wet etching requires work operations for detaching the reaction tube, manually cleaning the tube, and then reattaching and adjusting the tube. Further, the heat-processing apparatus needs to be shut down for a long time, thereby increasing downtime of the apparatus and lowering the operating rate thereof.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz.

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump (not shown in FIG. 1, but shown in FIG. 3 with a reference symbol 127). The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator described later (not shown in FIG. 1, but shown in FIG. 3 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, e.g., 100, semiconductor wafers W at predetermined intervals in the vertical direction. The wafer boat 11 is made of a heat-resistant and corrosion-resistant material, such as quartz. Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a film formation gas and a cleaning gas) into the reaction tube 2. Each of the process gas feed lines 17 is connected to a process gas supply source 20 through a mass-flow controller (MFC) 23 (not shown in FIG. 1) described later.

For example, in order to form a silicon nitride film (product film) on semiconductor wafers W by CVD, a first film formation gas containing a silane family gas and a second film formation gas containing a nitriding gas are used as the film formation gases. In this embodiment, the silane family gas is dichlorosilane (DCS: $SiH_2Cl_2$) gas and the nitriding gas is ammonia ($NH_3$) gas.

The cleaning gas is a gas containing a halogen acidic gas, such as hydrogen fluoride (HF). In this embodiment, the cleaning gas is a mixture gas of fluorine gas, hydrogen fluoride gas, and an inactive gas used as a dilution gas, such as nitrogen or a rare gas.

Although FIG. 1 shows only one process gas feed line 17, a plurality of process gas feed lines 17 are disposed in accordance with the type of process steps or the type of gases to be supplied into the reaction tube 2, in this embodiment. Specifically, a first film formation gas feed line, a second film formation gas feed line, and a cleaning gas feed line penetrate the sidewall of the reaction tube 2 near the bottom for supplying the first film formation gas, the second film formation gas, and the cleaning gas, respectively, into the reaction tube 2. The process gas supply section 20 will be described later in detail.

A purge gas supply line 18 also penetrates the sidewall of the reaction tube 2 near the bottom. The purge gas supply line 18 is connected to a purge gas supply source PGS through a mass-flow controller (MFC) (not shown).

Figure 3:
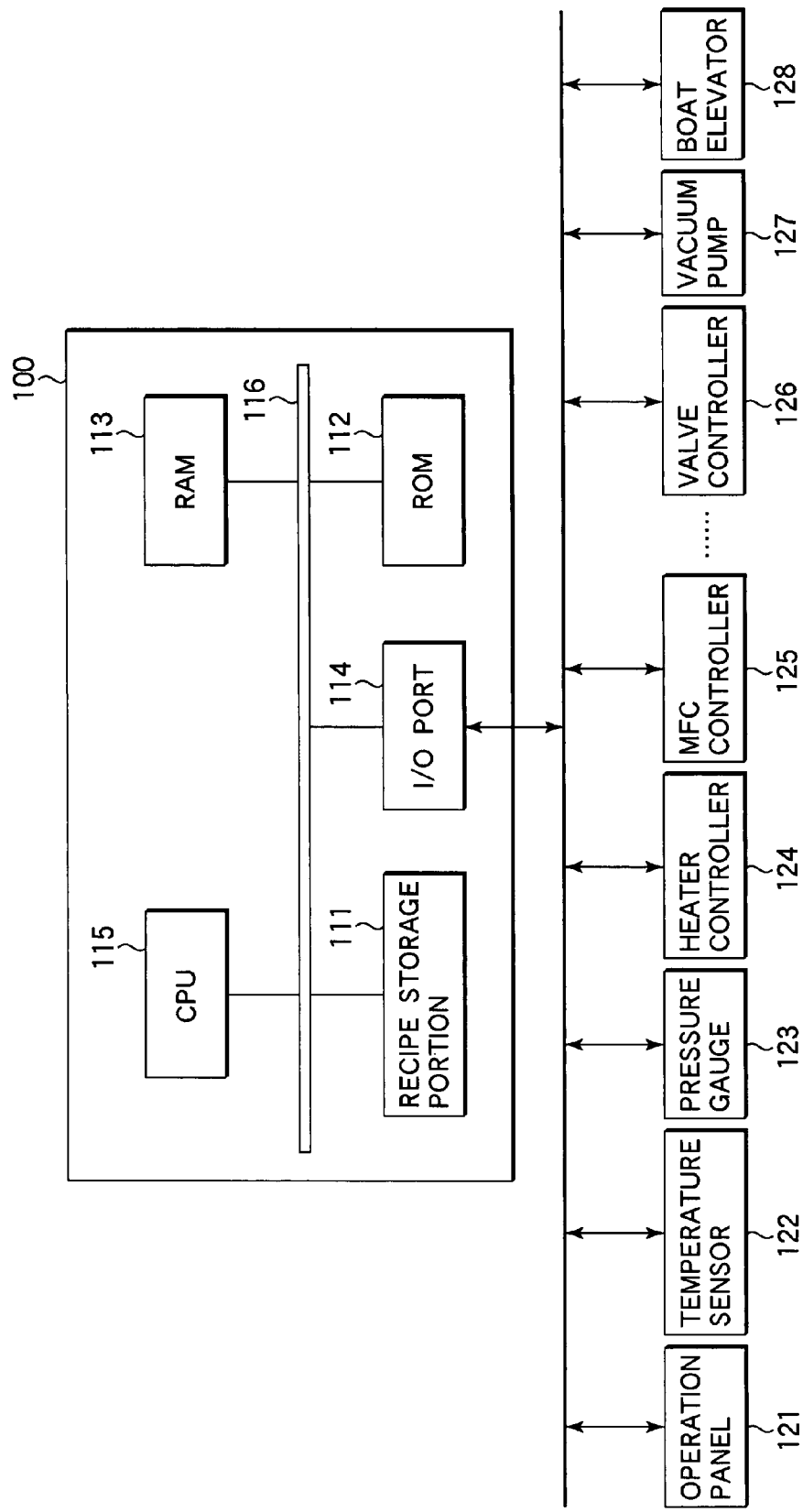
FIG. 3 is a view showing the structure of the control section of the apparatus shown in FIG. 1.

The heat-processing apparatus 1 further includes a control section 100 for controlling respective portions of the apparatus. FIG. 3 is a view showing the structure of the control section 100. As shown in FIG. 3, the control section 100 is connected to an operation panel 121, (a group of) temperature sensors 122, (a group of) pressure gages 123, heater controllers 124, MFC controllers 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line 5, process gas feed lines 17, and connection line 21e de-scribed later, and to transmit measurement values to the control section 100. The (group of) pressure gages 123 are configured to measure the pressure at respective portions inside the reaction tube 2, exhaust line 5, process gas feed lines 17, and connection line 21e described later, and to transmit measurement values to the control section 100.

The heater controllers 124 are configured to respectively control the heater 8, heater 16, and heaters 26 (26a to 26e) described later. The heater controllers 124 turn on these heaters to generate heat in accordance with instructions from the control section 100. Further, the heater controllers 124 measure the power consumption of these heaters, and transmit it to the control section 100.

The MFC controllers 125 are configured to respectively control the MFCs 23 disposed on the process gas feed lines 17 and connection line 21e and an MFC (not shown) disposed on the purge gas supply line 18. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line 5 and configured to exhaust gas inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat-processing apparatus 1 is manufactured, only the setup recipe is initially stored. The setup recipe is executed when a thermal model or the like for a specific heat-processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controllers 124, MFC controllers 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat-processing apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2 and exhaust line 5. Further, the CPU 115 outputs control signals, based on measurement data, to the heater controllers 124, MFC controllers 125, valve controllers 126, and vacuum pump 127, to control the respective portions mentioned above in accordance with a process recipe.

Figure 2:
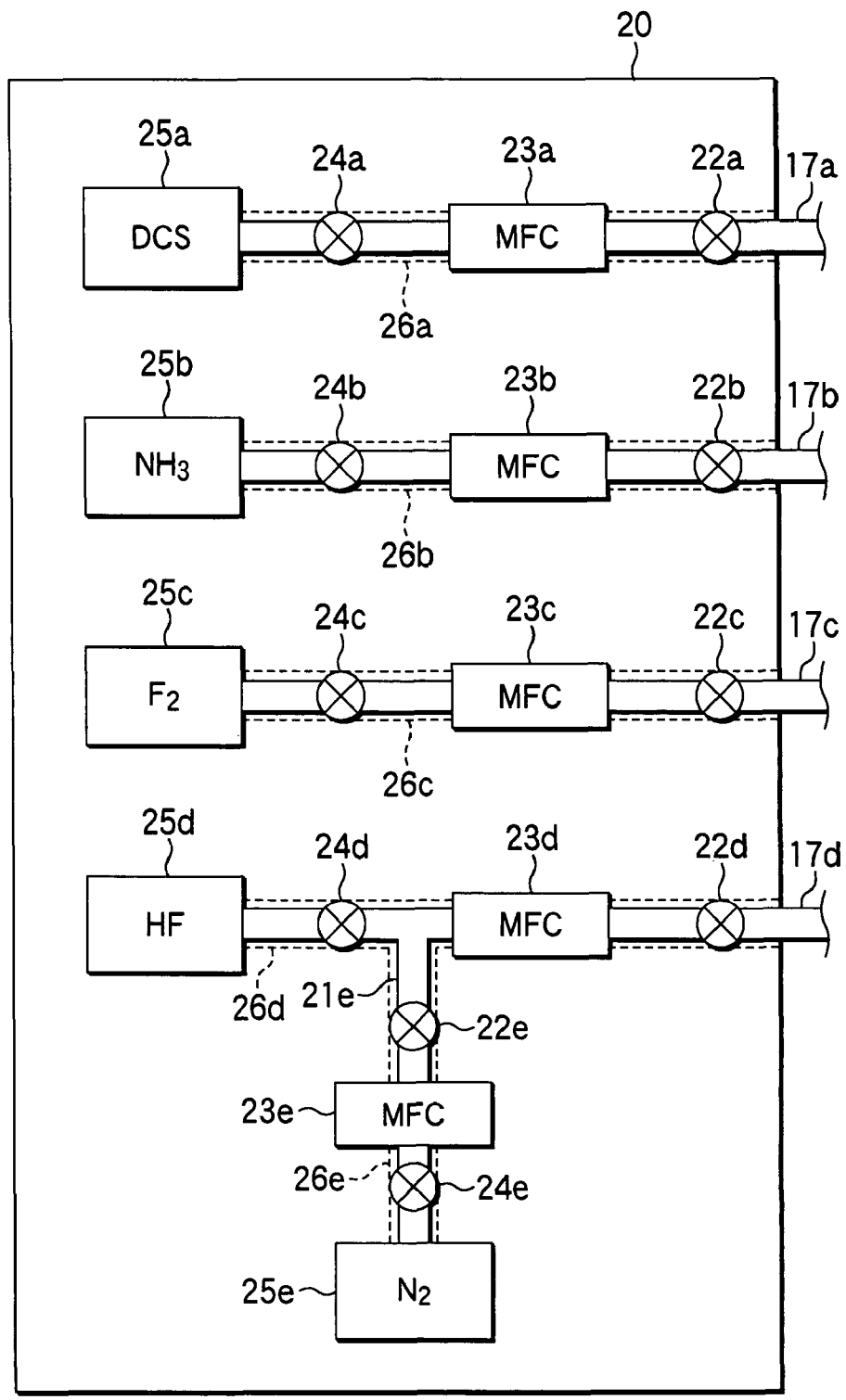
FIG. 2 is a view showing the structure of the gas supply section of the apparatus shown in FIG. 1.

FIG. 2 is a view showing the structure of the gas supply section 20 of the apparatus shown in FIG. 1. As shown in FIG. 2, the process gas feed lines 17 include feed lines 17a, 17b, 17c, and 17d disposed for respective gases, i.e., DCS, $NH_3$, $F_2$, and HF. These feed lines penetrate the sidewall of the reaction tube 2 near the bottom. Each of the process gas feed lines 17 (17a to 17d) is connected to a gas supply source 25 (25a to 25d) through a first valve 22 (22a to 22d), a mass-flow controller (MFC) 23 (23a to 23d) used as a flow rate control section, and a second valve 24 (24a to 24d).

The first valve 22 is located downstream from the MFC 23 (or closer to the reaction tube 2) to adjust the opening degree of the process gas feed line 17 downstream from the MFC 23. The MFC 23 is interposed between the first valve 22 and second valve 24 to control the flow rate of a gas flowing through the process gas feed line 17 to be a predetermined value. The second valve 24 is located downstream from the gas supply source 25 (or between the gas supply source 25 and MFC 23) to adjust the opening degree of the process gas feed line 17 downstream from the gas supply source 25. The gas supply source 25 is connected to one end of the process gas feed line 17 and stores a process gas to be supplied into the reaction tube 2 (through the process gas feed line 17).

In the gas supply section 20, each of the process gas feed lines 17 is surrounded by a heater 26 (26a to 26d). The heater 26 heats the interior of the process gas feed line 17 from outside to a predetermined temperature to form a predetermined atmosphere for a process gas flowing therethrough.

For example, a line for supplying hydrogen fluoride (HF) is formed of the hydrogen fluoride feed line 17d provided with the first valve 22d, MFC 23d, second valve 24d, and hydrogen fluoride supply source 25d. The hydrogen fluoride feed line 17d is surrounded by the heater 26d. As described above, the gas supply section 20 includes supply lines (process gas feed lines 17) for supplying gases of respective types into the reaction tube 2. Each of the process gas feed lines 17 is provided with the first valve 22, MFC 23, second valve 24, and gas supply source 25 from the downstream side, and is surrounded by the heater 26.

Further, the connection line 21e is connected to a portion between the second valve 24d and MFC 23d of the hydrogen fluoride feed line 17d to supply nitrogen ($N_2$) The connection line 21e is provided with a first valve 22e, an MFC 23e, a second valve 24e, a gas supply source 25e, and a heater 26e. The connection line 21e is arranged to perform nitrogen purge in the line for supplying hydrogen fluoride (hydrogen fluoride feed line 17d).

Figure 4:
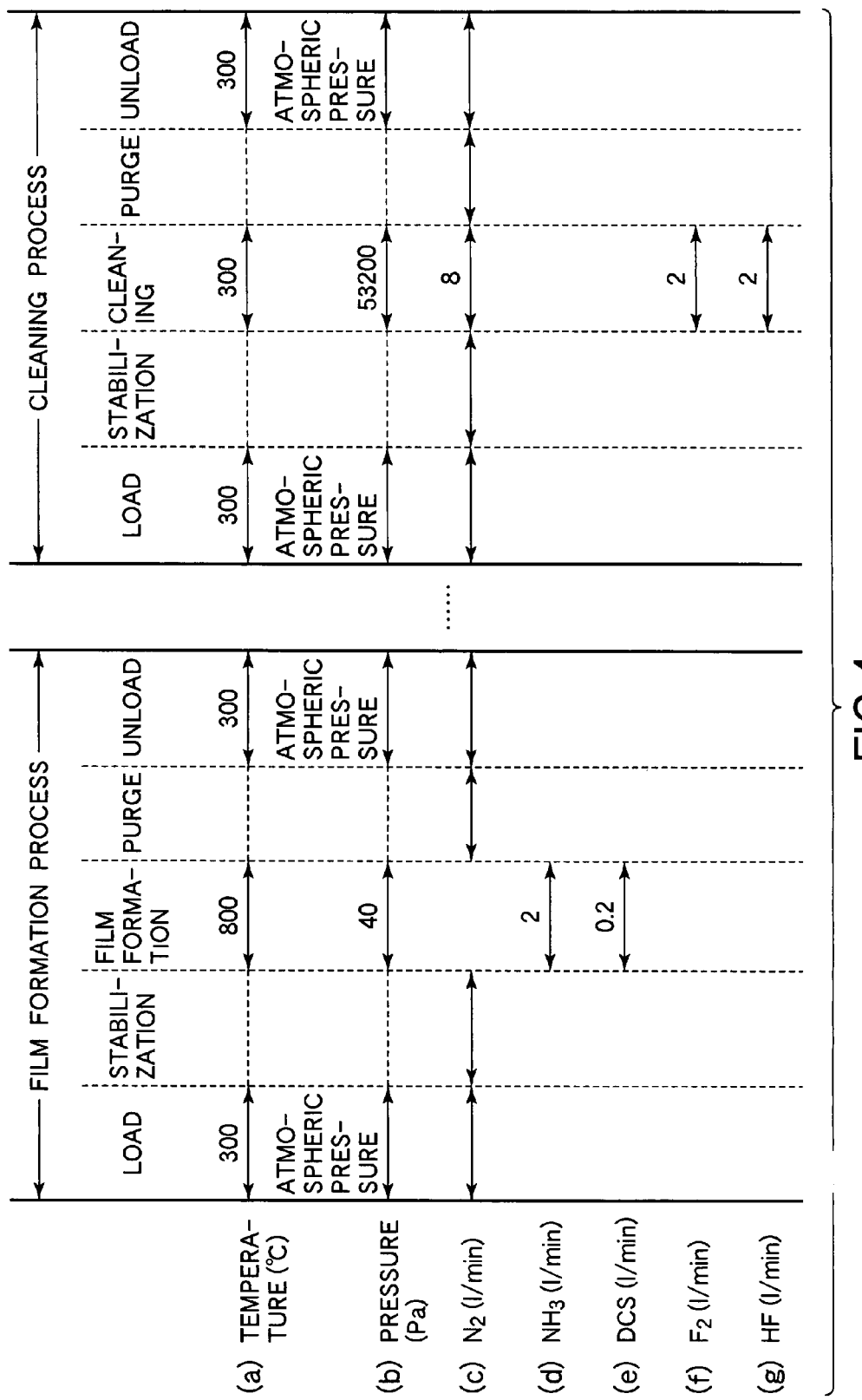
FIG. 4 is a view showing the recipe of a film formation process and a cleaning process according to an embodiment of the present invention.

Next, an explanation will be given of a method for using the heat-processing apparatus 1 described above. Specifically, at first, a silicon nitride film is formed by CVD on semiconductor wafers W within the reaction tube 2. Then, a cleaning process is performed to remove by-product films containing silicon nitride as the main component (it means 50% or more) deposited inside the reaction tube 2. FIG. 4 is a view showing the recipe of a film formation process and a cleaning process according to an embodiment of the present invention.

The respective components of the heat-processing apparatus described below 1 are operated under the control of the control section 100 (CPU 115). The temperature and pressure inside the reaction tube 2 and the gas flow rates during the processes are set in accordance with the recipe shown in FIG. 4, while the control section 100 (CPU 115) controls the heater controllers 124 (for the heaters 8, 16, and 26), MFC controllers 125 (for the MFCs 23 and so forth), valve controllers 126 (for the first valve 22, second valve 24, and so forth), and vacuum pump 127, as described above.

In the film formation process, at first, the interior of the reaction tube 2 is set by the heater 16 at a predetermined load temperature, such as 300° C., as shown in FIG. 4, (a). Further, nitrogen ($N_2$) is supplied through the purge gas supply line 18 into the reaction tube 2 at a predetermined flow rate, as shown in FIG. 4, (c). Then, the wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen is supplied through the purge gas supply line 18 into the reaction tube 2 at a predetermined flow rate, as shown in FIG. 4, (c). Further, the interior of the reaction tube 2 is set by the heater 16 at a predetermined film formation temperature (process temperature), such as 800° C., as shown in FIG. 4, (a). At this time, gas inside the reaction tube 2 is exhausted to set the interior of the reaction tube 2 at a predetermined pressure, such as 40 Pa (0.3 Torr), as shown in FIG. 4, (b). The pressure reduction and heating operations are continued until the reaction tube 2 is stabilized at the predetermined pressure and temperature (stabilization step).

The motor of the rotation mechanism 13 is controlled to rotate the rotary table 10 and thereby rotate the wafer boat 11. Along with the rotation of the wafer boat 11, the semiconductor wafers W supported on the wafer boat 11 are rotated, so that the wafers W are uniformly heated.

When the interior of the reaction tube 2 is stabilized at the predetermined pressure and temperature, the supply of nitrogen through the purge gas supply line 18 is stopped. Further, while the opening degrees of the first valve 22a, second valve 24a, first valve 22b, and second valve 24b are controlled, and the heaters 26a and 26b are controlled, the interior of the DCS feed line 17a and ammonia feed line 17b are set at a predetermined temperature, such as 40° C., and a predetermined pressure, such as 131,000 Pa (985 Torr).

Subsequently, the film formation gases are supplied through the process gas feed lines 17 (DCS feed line 17a and ammonia feed line 17b) into the reaction tube 2. In this embodiment, while the opening degrees of the first valve 22b and second valve 24b are controlled and the MFC 23b is controlled, ammonia is supplied at 2 liters/min, as shown in FIG. 4, (d). Further, while the opening degrees of the first valve 22a and second valve 24a are controlled and the MFC 23a is controlled, DCS is supplied at 0.2 liters/min, as shown in FIG. 4, (e). The film formation gases supplied into the reaction tube 2 are heated inside the reaction tube 2, and a silicon nitride film is formed on the surface of the semiconductor wafers W (film formation step).

When the silicon nitride film formed on the surface of the semiconductor wafers W reaches a predetermined thickness, the first valve 22b, second valve 24b, first valve 22a, and second valve 24a are closed, so that the supply of the film formation gases through the DCS feed line 17a and ammonia feed line 17b is stopped. Then, while gas inside the reaction tube 2 is exhausted, nitrogen is supplied through the purge gas supply line 18 into the reaction tube 2 at a predetermined flow rate, as shown in FIG. 4, (c), to exhaust gas from the reaction tube 2 to the exhaust line 5 (purge step). It is preferable to perform cyclic purge of repeating the gas exhaust and nitrogen supply for the interior of the reaction tube 2a plurality of times, in order to reliably exhaust the gas inside the process tube 2.

Then, nitrogen is supplied through the purge gas supply line 18 into the reaction tube 2 at a predetermined flow rate, as shown in FIG. 4, (c), so that the pressure inside the process tube 2 is returned to atmospheric pressure, as shown in FIG. 4, (b). Further, the interior of the reaction tube 2 is set at a predetermined temperature, such as 300° C., as shown in FIG. 4, (a). Then, the lid 6 is moved down by the boat elevator 128, and the wafer boat 11 is thereby unloaded along with the semiconductor wafer W with a silicon nitride film formed thereon (unload step).

Repeating this film formation process a plurality of times, silicon nitride produced by the film formation process is deposited (adhered) not only on the surface of semiconductor wafers W, but also on the inner surface of the reaction tube 2 and so forth, as by-product films. Accordingly, after the film formation process is repeated a plurality of times, a cleaning process is performed for the heat-processing apparatus 1.

In the cleaning process, at first, the interior of the reaction tube 2 is set by the heater 16 at a predetermined load temperature, such as 300° C., as shown in FIG. 4, (a). Further, nitrogen is supplied through the purge gas feed line 18 into the reaction tube 2 at a predetermined flow rate, as shown in FIG. 4, (c). Then, an empty wafer boat 11 that holds no semiconductor wafers W is placed on the lid 6, and the lid 6 is moved up by the boat elevator 128. Consequently, the wafer boat 11 is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 4, (c). Further, the interior of the reaction tube 2 is set by the heater 16 at a predetermined cleaning temperature, such as 300° C., as shown in FIG. 4, (a). Furthermore, gas inside the reaction tube 2 is exhausted to set the interior of the reaction tube 2 at a predetermined pressure, such as 53,200 Pa (400 Torr), as shown in FIG. 4, (b). The pressure reduction and heating operations are continued until the reaction tube 2 is stabilized at the predetermined pressure and temperature (stabilization step).

When the interior of the reaction tube 2 is stabilized at the predetermined pressure and temperature, the supply of nitrogen through the purge gas supply line 18 is stopped. Further, while the opening degrees of the first valve 22c, second valve 24c, first valve 22d, second valve 24d, first valve 22e, and second valve 24e are controlled, and the heaters 26c, 26d, and 26e are controlled, the interior of the fluorine feed line 17c, hydrogen fluoride feed line 17d, and connection line 21e are set at a predetermined temperature and a predetermined pressure. The temperature and pressure used at this time are described later in detail.

Subsequently, the cleaning gases are supplied through the process gas feed lines 17 (fluorine feed line 17c and hydrogen fluoride feed line 17d) into the reaction tube 2. In this embodiment, while the opening degrees of the first valve 22c and second valve 24c are controlled, and the MFC 23c is controlled, fluorine ($F_2$) is supplied at 2 liters/min, as shown in FIG. 4, (f). Further, while the opening degrees of the first valve 22d and second valve 24d are controlled, and the MFC 23d is controlled, hydrogen fluoride (HF) is supplied at 2 liters/min, as shown in FIG. 4, (g). Furthermore, while the opening degrees of the first valve 22e and second valve 24e are controlled, and the MFC 23e is controlled, nitrogen or dilution gas is supplied at 8 liters/min, as shown in FIG. 4(c).

The cleaning gases thus supplied into the reaction tube 2 are heated in the reaction tube 2, and fluorine in the cleaning gases is activated. The activated fluorine comes into contact with by-product films containing silicon nitride as the main component and deposited inside the heat-processing apparatus 1, and etches the by-product films. Consequently, the by-product films deposited inside the heat-processing apparatus 1 are removed (cleaning step).

When the cleaning of the by-product films deposited inside the reaction tube 2 is finished, the first valves 22c, 22d, and 22e and the second valves 24c, 24d, and 24e are closed, so that the supply of the cleaning gases through the cleaning gas feed lines 17b are stopped. Then, while gas inside the reaction tube 2 is exhausted, nitrogen is supplied through the purge gas supply line 18 into the reaction tube 2 at a predetermined flow rate, as shown in FIG. 4, (c), to exhaust gas from the reaction tube 2 to the exhaust line 5 (purge step). It is preferable to perform cyclic purge of repeating the gas exhaust and nitrogen supply for the interior of the reaction tube 2a plurality of times, in order to reliably exhaust the gas inside the process tube 2.

Then, nitrogen is supplied through the purge gas supply line 18 into the reaction tube 2 at a predetermined flow rate, as shown in FIG. 4, (c), so that the pressure inside the process tube 2 is returned to atmospheric pressure, as shown in FIG. 4, (b). Then, the lid 6 is moved down by the boat elevator 128, and the cleaned wafer boat 11 is thereby unloaded from the reaction tube 2 (unload step).

As the process described above is being performed, by-product films containing silicon nitride as the main component and deposited on the inner surface of the reaction tube 2, the surface of the wafer boat 11, and so forth are removed. Thereafter, a wafer boat 11 with a new lot of semiconductor wafers W mounted thereon is placed on the lid 6, and the film formation process is started again in the manner described above.

Figure 5:
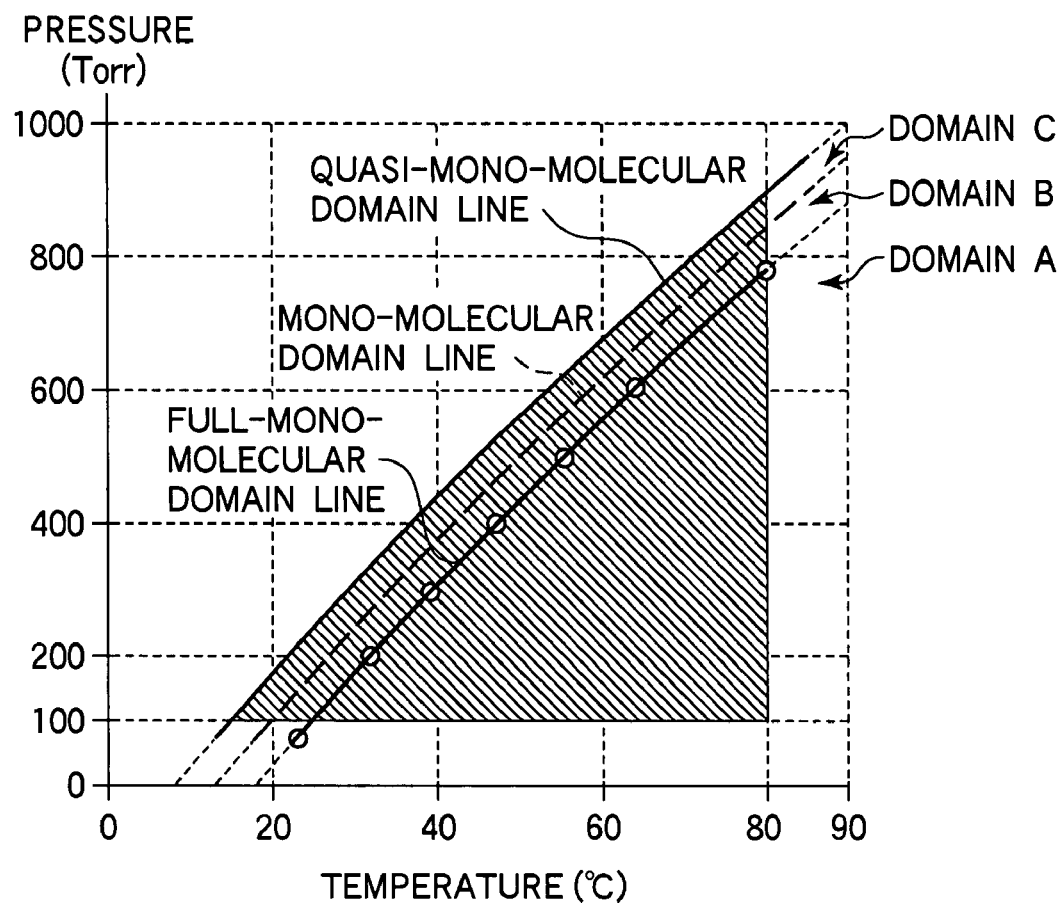
FIG. 5 is a graph showing the state of hydrogen fluoride depending on changes in temperature and pressure.

FIG. 5 is a graph showing the state of hydrogen fluoride depending on changes in temperature and pressure. As shown in FIG. 5, along with changes in temperature and pressure, regions A, B, and C having different states of hydrogen fluoride appear. The region A is a part below (lower in pressure and higher in temperature) a full-mono-molecular domain line shown in FIG. 5, in which hydrogen fluoride takes on a full-mono-molecular state. The region B is a part between the full-mono-molecular domain line and mono-molecular domain line shown in FIG. 5, in which hydrogen fluoride takes on a near-mono-molecular state. The region C is a part between the quasi-mono-molecular domain line and mono-molecular domain line shown in FIG. 5, in which hydrogen fluoride takes on a quasi-mono-molecular state. The quasi-mono-molecular state is a state where hydrogen fluoride has an average molecular weight of about 22 to 23. On the other hand, the full-mono-molecular state is a state where all the molecules of hydrogen fluoride are in the mono-molecular state, so hydrogen fluoride essentially has an average molecular weight of 20. The near-mono-molecular state is an intermediate state between these two states, so hydrogen fluoride has an average molecular weight of about 20 to 22.

According to the definition in this specification, a full-mono-molecular domain consists of the region A in which hydrogen fluoride takes on the full-mono-molecular state. A mono-molecular domain consists of the region A in which hydrogen fluoride takes on the full-mono-molecular state and the region B in which hydrogen fluoride takes on the mono-molecular state. A quasi-mono-molecular domain consists of the region A in which hydrogen fluoride takes on the full-mono-molecular state, the region B in which hydrogen fluoride takes on the mono-molecular state, and the region C in which hydrogen fluoride takes on the quasi-mono-molecular state.

The temperature and pressure inside the hydrogen fluoride feed line 17$d$ for supplying hydrogen fluoride are set to form an atmosphere that belongs to the quasi-mono-molecular domain (A+B+C). Where the atmosphere is formed to belong to the quasi-mono-molecular domain, the hydrogen fluoride is inhibited from being liquefied or clustered.

If the hydrogen fluoride is liquefied, metal fluoride may be deposited inside the hydrogen fluoride feed line 17$d$ and generate particles. However, this embodiment is arranged to form an atmosphere that belongs to the quasi-mono-molecular domain inside the hydrogen fluoride feed line 17$d$, so the hydrogen fluoride is inhibited from being liquefied, thereby suppressing particle generation and component damage.

Figure 6A:
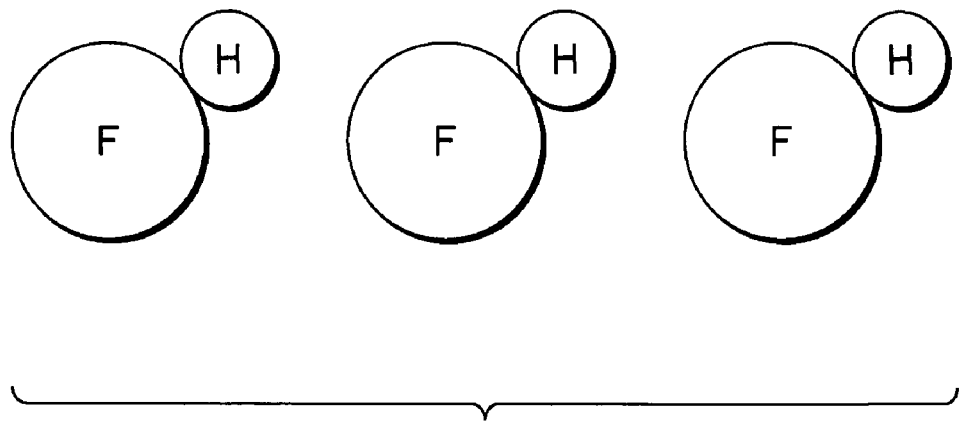
FIGS. 6A and 6B are views for explaining a clustering manner of hydrogen fluoride.
Figure 6B:
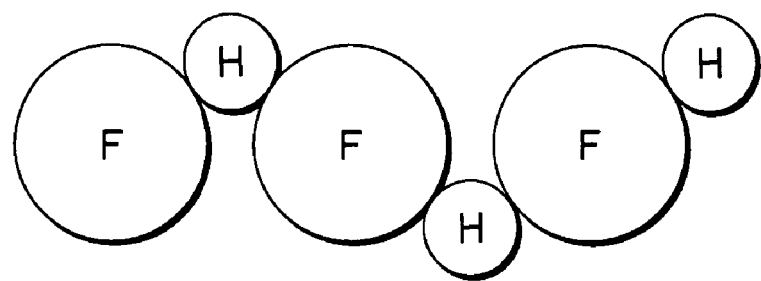

FIGS. 6A and 6B are views for explaining a clustering manner of hydrogen fluoride. Clustering of hydrogen fluoride means polymerization of the hydrogen fluoride from the state shown in FIG. 6A to the state shown in FIG. 6B, for example. This occurs because fluorine has a very large electronegativity, and strongly attracts the shared electron pairs of HF. Consequently, F is charged to be F$^-$ while H is charged to be H$^+$, so they form a loose bond (hydrogen bond) between adjacent molecules. If hydrogen fluoride is clustered, the molecular weight and/or specific heat thereof, which are utilized for flow rate control, are changed, so the flow rate of hydrogen fluoride supplied into the reaction tube 2 can be hardly controlled.

For example, where the MFC 23$d$ has a structure to perform flow rate control by use of a heat sensor, an increase in the specific heat of hydrogen fluoride results in a problem such that the heat sensor of the MFC 23$d$ recognizes a larger flow rate than the actual gas flow rate, so the MFC 23$d$ performs control to decrease the flow rate. In this case, it becomes difficult to stably supply hydrogen fluoride at a predetermined flow rate into the reaction tube, and thus it may be difficult to stably perform cleaning of the heat-processing apparatus. On the other hand, according to this embodiment, the interior of the hydrogen fluoride feed line 17$d$ is set at a temperature and a pressure within the quasi-mono-molecular domain to inhibit hydrogen fluoride from being clustered. In this case, the flow rate of hydrogen fluoride supplied into the reaction tube 2 is controlled while the molecular weight and/or specific heat of hydrogen fluoride are prevented from being changed around the MFC 23$d$, so that the actual flow rate can be very close to an indicated value. Consequently, it is possible to stably supply hydrogen fluoride at a predetermined flow rate into the reaction tube, and thereby to stably perform cleaning of the heat-processing apparatus.

In order to set hydrogen fluoride supplied through the hydrogen fluoride feed line 17$d$ to form an atmosphere (with an average molecular weight of 20 or more and 23 or less) that belongs to the quasi-mono-molecular domain (regions A+B+C), the interior of the hydrogen fluoride feed line 17$d$ can be set to have various conditions, as described below, for example. Specifically, conditions (1) comprise a pressure of 106,400 Pa (800 Torr) or more and a temperature of about 70° C. or more; conditions (2) comprise a pressure of 66,500 to 106,400 Pa (500 to 800 Torr) and a temperature of about 45 to 70° C.; and conditions (3) comprise a pressure of 26,600 to 66,500 Pa (200 to 500 Torr) and a temperature of about 22 to 45° C. Which group of the conditions (1) to (3) can be used depends on various factors, such as the specifications of devices associated with the hydrogen fluoride feed line 17$d$, e.g., the heat-resistance of the MFC 23. In light of these factors, the conditions concerning the hydrogen fluoride feed line 17$d$ may be selected as follows, for example.

The pressure inside the hydrogen fluoride feed line 17$d$ is preferably set to be 6,650 Pa (50 Torr) or more, and more preferably to be 13,300 Pa (100 Torr) or more. Where the pressure is set to be as described above, the flow rate control can be easily performed. The temperature inside the hydrogen fluoride feed line 17$d$ is preferably set to be 80° C. or less. Where the temperature exceeds 80° C., a problem may arise, depending on the heat-resistance of components used for the hydrogen fluoride feed line 17$d$. Accordingly, the temperature and pressure inside the hydrogen fluoride feed line 17$d$ are preferably set to be within a range indicated by a shaded portion in FIG. 5.

Further, the pressure inside the hydrogen fluoride feed line 17$d$ is preferably set to be 66,500 Pa (500 Torr) or less. The temperature inside the hydrogen fluoride feed line 17$d$ is preferably set to be 50° C. or more. Where the range described above is used, the flow rate control can be more easily performed, and the corrosion resistance is improved. In conclusion, the pressure inside the hydrogen fluoride feed line 17$d$ is preferably set to be 13,300 Pa (100 Torr) to 66,500 Pa (500 Torr). The temperature inside the hydrogen fluoride feed line 17$d$ is preferably set to be 50° C. to 80° C. In this embodiment, the temperature and pressure inside the hydrogen fluoride feed line 17$d$ are set at 50° C. and 66,500 Pa (500 Torr), respectively.

The temperature and pressure inside the hydrogen fluoride feed line 17$d$ is preferably set for hydrogen fluoride supplied therethrough to be within the mono-molecular domain, and more preferably to be within the full-mono-molecular domain. Where the temperature and pressure inside the hydrogen fluoride feed line 17$d$ are set to be within the mono-molecular domain and further to be within the full-mono-molecular domain, hydrogen fluoride can be further inhibited from being liquefied or clustered.

The temperature and pressure inside the fluorine feed line 17$c$ and connection line 21$e$ are set to be room temperature to 40° C., and atmospheric pressure to 131,000 Pa (985 Torr), respectively, as conventionally used, for example. However, the temperature and pressure inside the fluorine feed line 17$c$ and connection line 21$e$ are set to have the same temperature and pressure as in the hydrogen fluoride feed line 17$d$.

<Experiment>

Using the heat-processing apparatus shown in FIGS. 1 and 2, a film formation process and a cleaning process were performed as described above, and then deposition of metal fluoride inside the hydrogen fluoride feed line 17$d$ was observed. As a result, no deposition of metal fluoride was observed inside the hydrogen fluoride feed line 17$d$. Accordingly, it has been confirmed that this embodiment can reduce particle generation and component damage.

In a present example PE according to this embodiment, under the supply conditions described above (the temperature and pressure inside the hydrogen fluoride feed line 17$d$ were set at 50° C. and 66,500 Pa (500 Torr), respectively), the flow rate of hydrogen fluoride gas was set at 0.5, 1, 2, 3, and 5 liters/min (set value), and the actual flow rate thereof was measured (measurement value). In a comparative example CE, while the temperature and pressure inside the hydrogen fluoride feed line 17d were set at 40° C. and 131,000 Pa (985 Torr), respectively, as conventionally used, the actual flow rate (measurement value) was measured.

Figure 7:
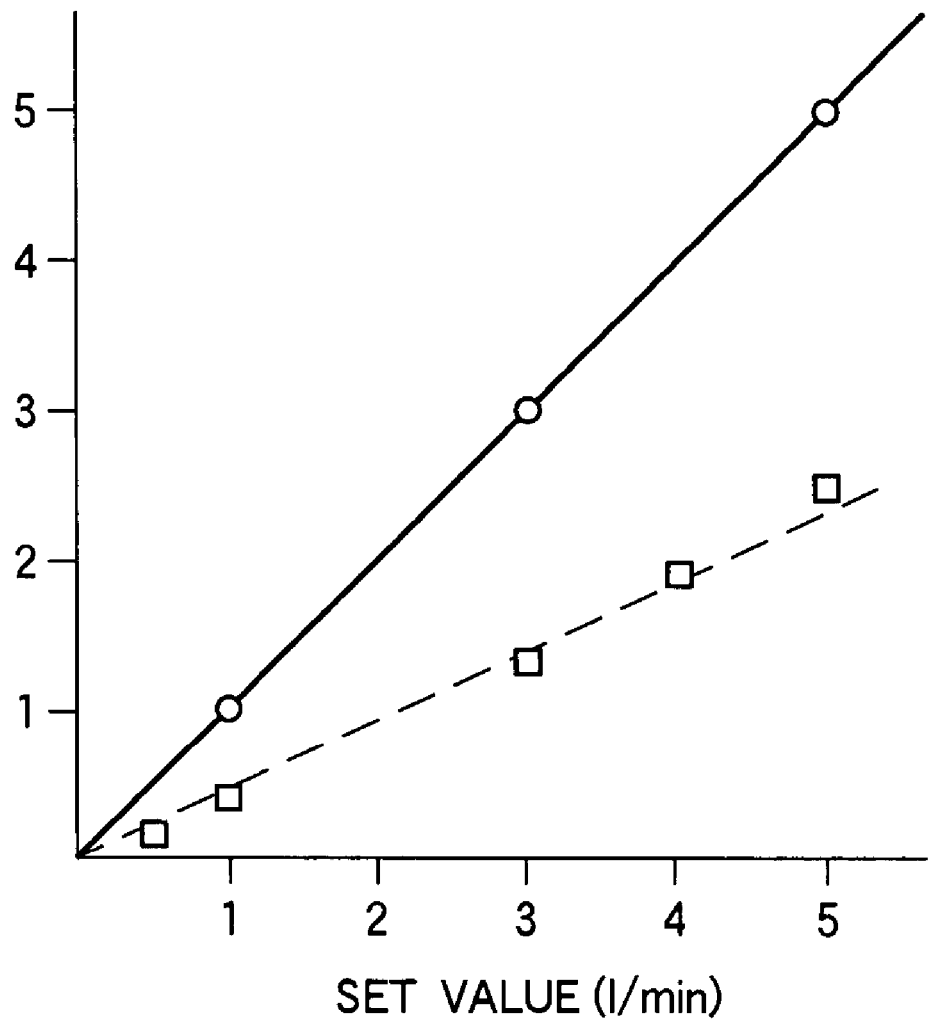
FIG. 7 is a graph showing the relationship between the set value and measurement value of the flow rate of hydrogen fluoride gas.
Figure 8:
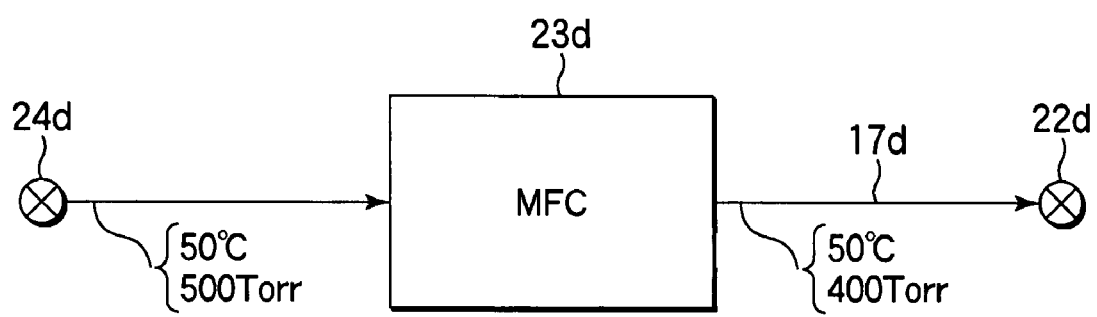
FIG. 8 is a view showing temperature and pressure conditions around an MFC according to a modification of the embodiment described above.

FIG. 7 is a graph showing the relationship between the set value and measurement value of the flow rate of hydrogen fluoride gas, obtained by this experiment. FIG. 7 shows a measurement value under the supply conditions of the present example PE according to this embodiment, and a measurement value under the temperature and pressure of the comparative example CE. As shown in FIG. 7, in the case of the comparative example CE, the measurement value of the flow rate of hydrogen fluoride gas was almost half of the set value. On the other hand, in the case of the present example PE, the measurement value of the flow rate of hydrogen fluoride gas was almost the same as the set value. Accordingly, it has been confirmed that this embodiment makes it possible to stably supply hydrogen fluoride at a predetermined flow rate into the reaction tube, and thereby to stably perform cleaning of the heat-processing apparatus.

As described above, this embodiment is arranged to set the temperature and pressure inside hydrogen fluoride feed line 17d to be within the quasi-mono-molecular domain, so that hydrogen fluoride is inhibited from being clustered. Consequently, it is possible to stably supply hydrogen fluoride at a predetermined flow rate into the reaction tube 2, and thereby to stably perform cleaning of the heat-processing apparatus. Further, since hydrogen fluoride is inhibited from being liquefied, it is possible to reduce particle generation and component damage.

In the embodiment described above, the temperature and pressure inside the hydrogen fluoride feed line 17d are set at 50° C. and 66,500 Pa (500 Torr), respectively. More specifically, however, it is necessary to consider a pressure difference generated between the upstream side (primary side) and downstream side (secondary side) of the MFC 23d. The pressure downstream from the MFC 23d is determined depending on the pressure inside the reaction tube 2 in cleaning (for example, 100 to 400 Torr), and is inevitably required to be higher than this pressure. On the other hand, the pressure upstream from the MFC 23d needs to be higher than the downstream side, but an increase in this pressure necessitates a higher temperature to form an atmosphere that belong to the quasi-mono-molecular domain as described above.

For example, conventional MFCs require a pressure difference of about 400 to 500 Torr between the primary side and secondary side. Where such an MFC is used as the MFC 23d, if the pressure downstream from the MFC 23d is 400 Torr, the pressure upstream from the MFC 23d needs to be 800 Torr to 900 Torr. In this case, a temperature higher than 80° C. is undesirably required to form an atmosphere that belongs to the quasi-mono-molecular domain. In light of this point, this embodiment employs a low-pressure-difference MFC that can operate with a small pressure difference between the primary side and secondary side, so that the pressure difference between the upstream side and downstream side of the MFC 23d is about 50 to 150 Torr (6,650 to 19,950 Pa).

Further, only a part inside the hydrogen fluoride feed line 17d at least around the MFC 23d (for example, a portion between the first valve 22d and second valve 24d) may be controlled to have a temperature and a pressure within the quasi-mono-molecular domain. Also in this case, it is possible to stably supply hydrogen fluoride at a predetermined flow rate into the reaction tube, and thereby to stably perform cleaning of the heat-processing apparatus.

The temperature and pressure inside the hydrogen fluoride feed line 17d downstream from the MFC 23d may be set not to be within the quasi-mono-molecular domain. In other words, the temperature and pressure inside the hydrogen fluoride feed line 17d at least upstream from the MFC 23d are required to be within the quasi-mono-molecular domain. Also in this case, hydrogen fluoride is in the quasi-mono-molecular state when it passes through the MFC 23d, so it is possible to stably supply hydrogen fluoride into the reaction tube 2, and thereby to stably perform cleaning of the heat-processing apparatus. Further, it is possible to reduce particle generation and component damage.

Figure 9:
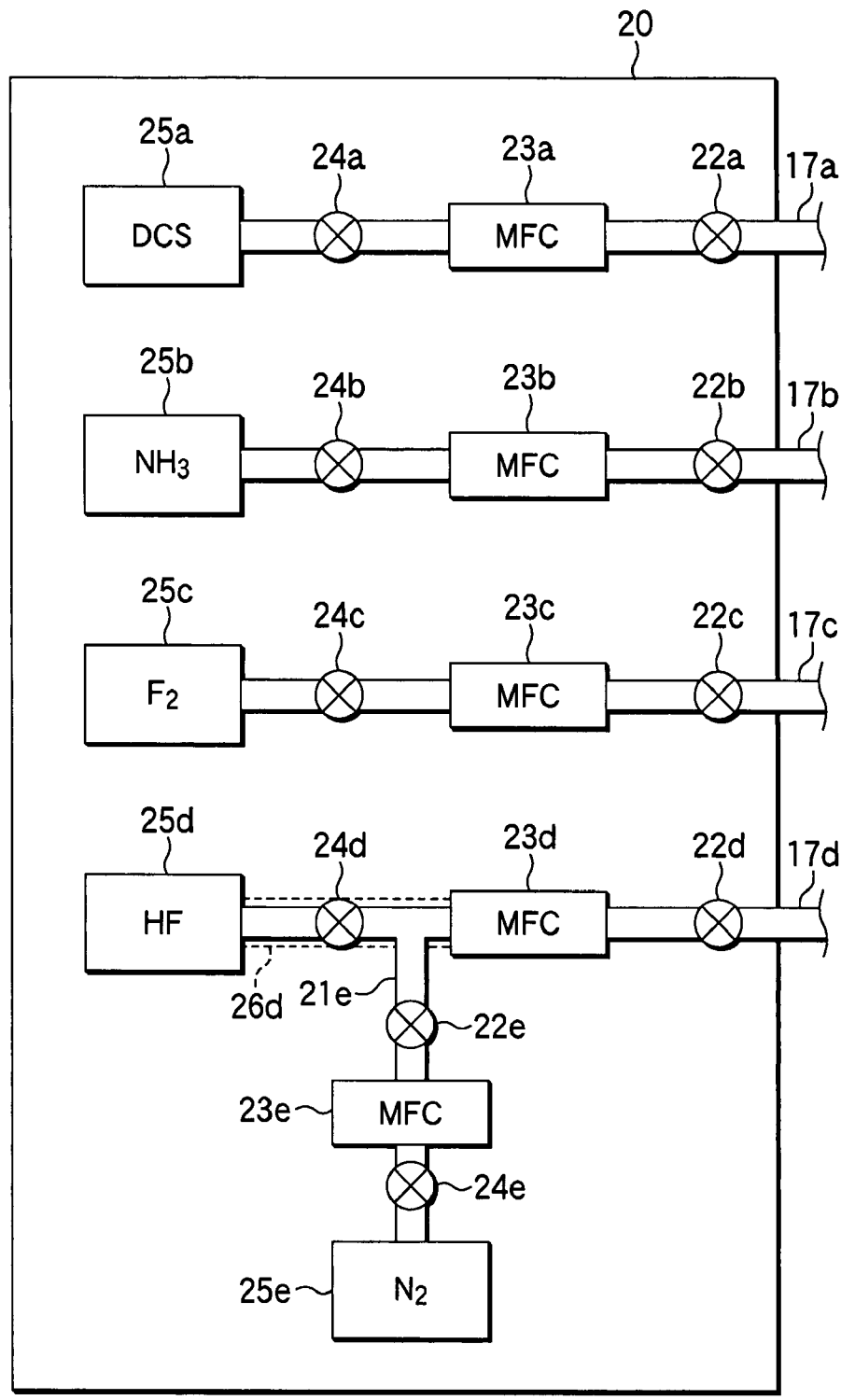
FIG. 9 is a view showing the structure of a gas supply section according to another embodiment of the present invention.

FIG. 9 is a view showing the structure of a gas supply section according to another embodiment of the present invention. In this embodiment, the hydrogen fluoride feed line 17d is provided with a heater 26 only upstream from the MFC 23d. In this case, the structure of the gas supply section 20 can be simplified. The DCS feed line 17a is preferably heated by a heater 26a to, e.g., about 40° C. to prevent DCS from being liquefied.

Figure 10:
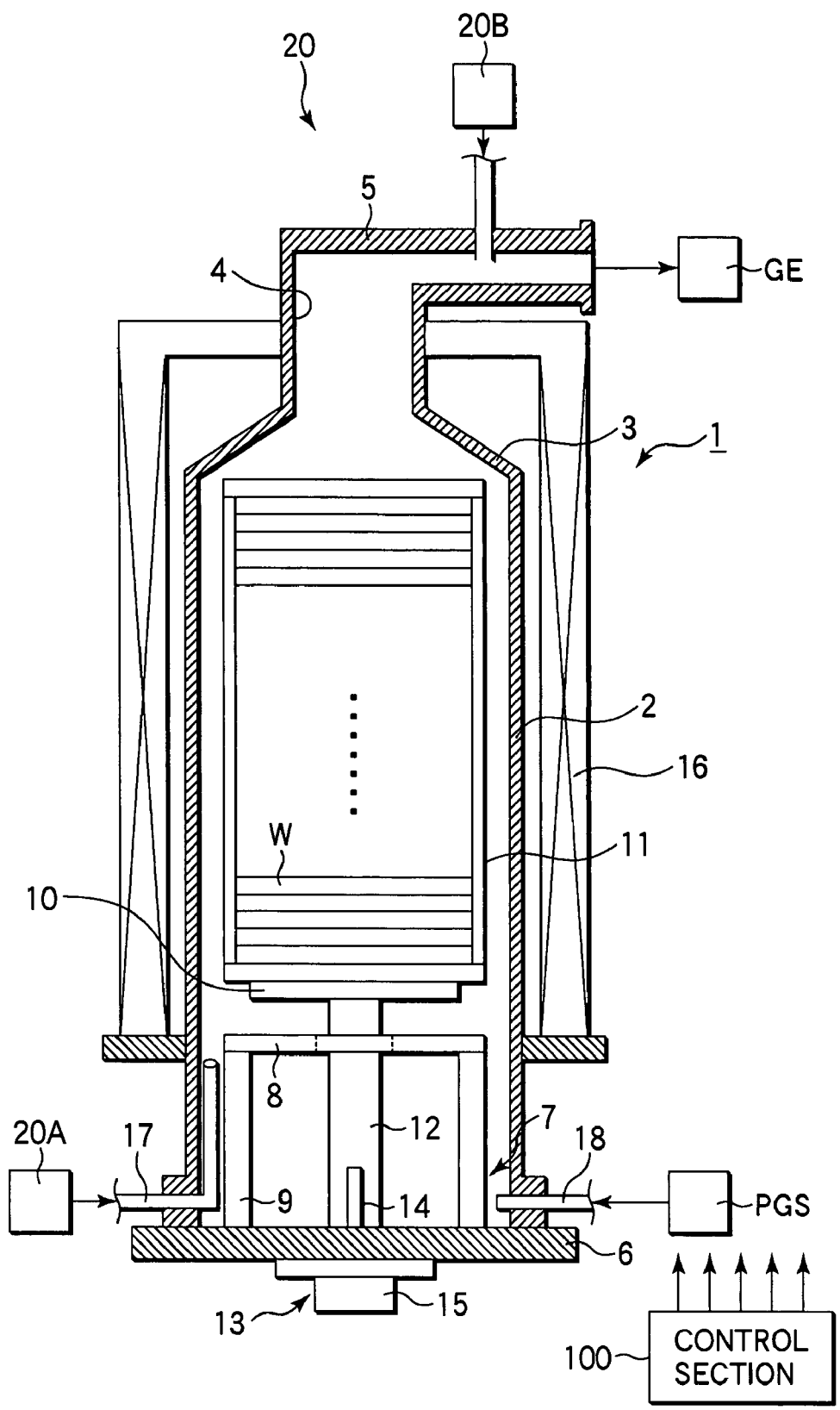
FIG. 10 is a view showing the structure of a heat-processing apparatus according to another embodiment of the present invention.
Figure 11:
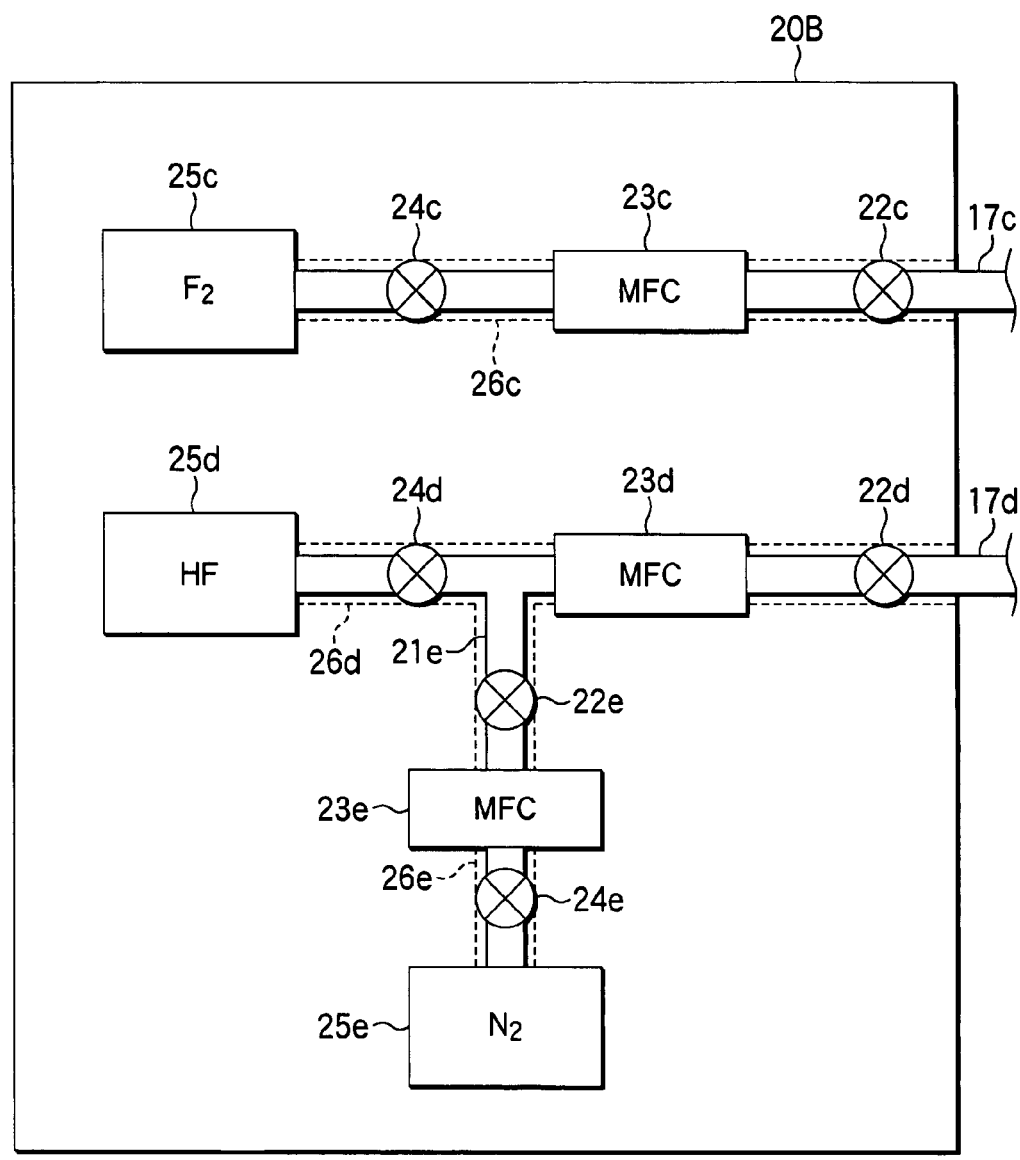
FIG. 11 is a view showing the structure of the cleaning gas supply section of the apparatus shown in FIG. 10.

FIG. 10 is a view showing the structure of a heat-processing apparatus according to another embodiment of the present invention. FIG. 11 is a view showing the structure of the cleaning gas supply section of the apparatus shown in FIG. 10. In the embodiment described above, the gas supply section 20 connected to the reaction tube 2 near the bottom thereof includes a film formation gas supply section and a cleaning gas supply section. Alternatively, for example, as shown in FIG. 10, a film formation gas supply section 20A and a cleaning gas supply section 20B may be separately disposed. In this case, the cleaning gas supply section 20B including cleaning gas sources (fluorine and hydrogen fluoride) may be connected to the exhaust line 5 of the heat-processing apparatus 1.

In the embodiment described above, the cleaning gas is a mixture gas of fluorine, hydrogen fluoride, and nitrogen. However, the cleaning gas is only required to contain a halogen acidic gas, and thus, for example, it may contain no nitrogen gas as a dilution gas. In the embodiment described above, the halogen acidic gas is hydrogen fluoride. However, the halogen acidic gas is not limited to hydrogen fluoride (HF), and it may be, e.g., HCl, HBr, or HI.

In the embodiment described above, the product film formed on wafers W is a silicon nitride film, and by-product films deposited on the inner surface of the reaction tube 2 and so forth contain silicon nitride as the main component (it means 50% or more). Where the product film is a silicon nitride film, a silane family gas, which is one of the film formation gases, may be one or more gases selected from the group consisting of dichlorosilane (DCS: $SiH_2Cl_2$), hexachlorodisilane (HCD: $Si_2Cl_6$), monosilane ($SiH_4$), disilane ($Si_2Cl_6$), hexamethyldisilazane (HMDS), tetrachlorosilane (TCS), disilylamine (DSA), trisilylamine (TSA), bistertial-butylaminosilane (BTBAS). The nitriding gas, which is the other of the film formation gases, may be ammonia ($NH_3$) gas or nitrogen ($N_2$) gas.

The cleaning target or by-product film is not limited to a specific one, as long as it can be removed by a cleaning gas containing a halogen acidic gas. For example, the cleaning target may be a by-product film containing, as the main component, a substance selected from the group consisting of $Al_2O_3$, HfSiOx, $HfO_2$, TEOS, SiN, SiC, SiOC, SiCN, $Ta_2O_5$, $Nb_2O_5$, BSTO, STO, and AlHfO. A by-product film made of such a substance may be generated in a film formation process for forming a product film made of the substance on wafers W.

Figure 12:
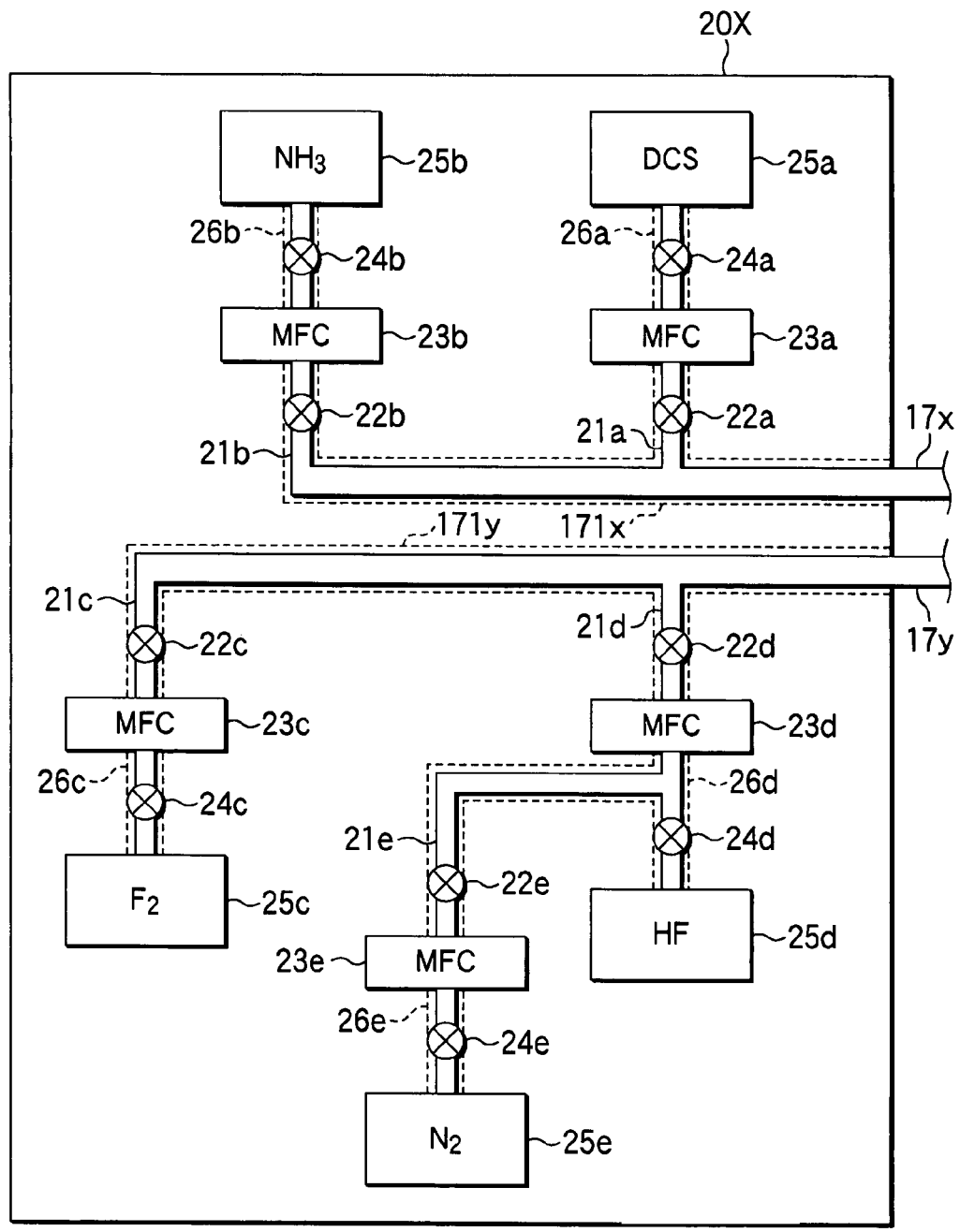
FIG. 12 is a view showing the structure of a gas supply section according to another embodiment of the present invention.

FIG. 12 is a view showing the structure of a gas supply section according to another embodiment of the present invention. In the embodiment described above, the process gas feed lines 17 are disposed in accordance with the type of gases. Alternatively, in the gas supply section 20x shown in FIG. 12, process gas feed lines 17 (a film formation gas feed line 17x and a cleaning gas feed line 17y) are disposed in accordance with the type of process steps. In this case, the film formation gas feed line 17x is connected to a connection line 21a corresponding to the DCS feed line 17a and a connection line 21b corresponding to the ammonia feed line 17b. The cleaning gas feed line 17y is connected to a connection line 21c corresponding to the fluorine feed line 17c and a connection line 21d corresponding to the hydrogen fluoride feed line 17d. The film formation gas feed line 17x and cleaning gas feed line 17y are respectively provided with heaters (a heater 171x for the film formation gas feed line and a heater 171y for the cleaning gas feed line) for heating the respective feed lines at predetermined temperatures.

Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiments described above, the heat-processing apparatus employed is a heat-processing apparatus of the batch type having a single-tube structure. However, for example, the present invention may be applied to a vertical heat-processing apparatus of the batch type having a reaction tube of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., an LCD.

The control section 100 of the heat-processing apparatus is not limited to a specific system, and it may be realized by an ordinary computer system. For example, a program for executing the process described above may be installed into a multi-purpose computer, using a storage medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined storage medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation apparatus for a semiconductor process, the apparatus comprising:
a reaction chamber configured to accommodate a target substrate;
a heater configured to heat an interior of the reaction chamber;
an exhaust system configured to exhaust the interior of the reaction chamber;
a film formation gas supply system configured to supply a film formation gas, for forming a product film on the target substrate, into the reaction chamber;
a cleaning gas supply system configured to supply a cleaning gas, which contains a hydrogen fluoride gas for removing a by-product film derived from the film formation gas, into the reaction chamber; and
a control section configured to control an operation of the apparatus,
wherein the cleaning gas supply system includes
a hydrogen fluoride line connecting a gas supply source of the hydrogen fluoride gas to the reaction chamber,
a flow rate controller provided on the hydrogen fluoride line, and
a piping heater disposed around a piping that defines an upstream line portion of the hydrogen fluoride line between the gas supply source and the flow rate controller, and
wherein the control section includes a storage medium storing program instructions for execution on a processor, which, when executed by the processor, cause the apparatus to conduct a sequence that comprises:
forming a predetermined atmosphere inside the upstream line portion by setting a temperature of 50 to 80° C. and a pressure of 13,300 to 66,500 Pa inside the upstream line portion, the predetermined atmosphere causing the hydrogen fluoride gas to have an average molecular weight of 20 or more and 23 or less;
supplying the hydrogen fluoride gas from the gas supply source through the upstream line portion having the predetermined atmosphere thus formed and the flow rate controller, thereby supplying a cleaning gas containing the hydrogen fluoride gas into the reaction chamber; and
etching and removing the by-product film deposited on an inner surface of the reaction chamber, by use of the cleaning gas thus supplied.

2. The apparatus according to claim 1, wherein an inactive gas supply line for supplying an inactive gas to be mixed with the hydrogen fluoride gas is connected to the upstream line portion.

3. The apparatus according to claim 2, wherein the inactive gas supply line is provided with a flow rate controller for the inactive gas.

4. The apparatus according to claim 2, wherein a heater is disposed around a piping that defines the inactive gas supply line.

5. The apparatus according to claim 1, wherein the sequence further comprises, before removing the by-product film,
forming the product film on the target substrate by CVD within the reaction chamber, during which the by-product film is deposited on the inner surface of the reaction chamber.

6. The apparatus according to claim 1, wherein the flow rate controller is configured to perform the flow rate control of the hydrogen fluoride gas by use of a heat sensor.

7. The apparatus according to claim 1, wherein the flow rate controller generates a pressure difference of 6,650 to 19,950 Pa between the upstream and downstream sides, while the reaction chamber has a pressure of 13,300 to 53,200 Pa therein.

8. A film formation apparatus for a semiconductor process, the apparatus comprising:
a reaction chamber configured to accommodate a target substrate;

a heater configured to heat an interior of the reaction chamber;

an exhaust system configured to exhaust the interior of the reaction chamber;

a film formation gas supply system configured to supply a film formation gas, for forming a product film on the target substrate, into the reaction chamber; and a cleaning gas supply system configured to supply a cleaning gas, which contains a hydrogen fluoride gas for removing a by-product film derived from the film formation gas, into the reaction chamber;

wherein the cleaning gas supply system includes a hydrogen fluoride line connecting a gas supply source of the hydrogen fluoride gas to the reaction chamber, a flow rate controller provided on the hydrogen fluoride line, a piping heater disposed around a piping that defines an upstream line portion of the hydrogen fluoride line between the gas supply source and the flow rate controller, and atmosphere forming means for forming a predetermined atmosphere inside the upstream line portion by setting a temperature of 50 to 80° C. and a pressure of 13,300 to 66,500 Pa inside the upstream line portion, the predetermined atmosphere causing the hydrogen fluoride gas to have an average molecular weight of 20 or more and 23 or less.

9. The apparatus according to claim 8, wherein the flow rate controller is configured to perform the flow rate control of the hydrogen fluoride gas by use of a heat sensor.

10. The apparatus according to claim 8, wherein the flow rate controller generates a pressure difference of 6,650 to 19,950 Pa between the upstream and downstream sides, while the reaction chamber has a pressure of 13,300 to 53,200 Pa therein.

11. The apparatus according to claim 8, wherein an inactive gas supply line for supplying an inactive gas to be mixed with the hydrogen fluoride gas is connected to the upstream line portion.

12. The apparatus according to claim 11, wherein the inactive gas supply line is provided with a flow rate controller for the inactive gas.

13. The apparatus according to claim 11, wherein a heater is disposed around a piping that defines the inactive gas supply line.

* * * * *